(12) United States Patent
Suzuki et al.

(10) Patent No.: US 8,378,350 B2
(45) Date of Patent: Feb. 19, 2013

(54) DISPLAY DEVICE

(75) Inventors: Ryouhei Suzuki, Mobara (JP); Yasuyuki Yamada, Chiba (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 12 days.

(21) Appl. No.: 13/031,957

(22) Filed: Feb. 22, 2011

(65) Prior Publication Data

US 2011/0204372 A1 Aug. 25, 2011

(30) Foreign Application Priority Data

Feb. 23, 2010 (JP) .................................. 2010-037720

(51) Int. Cl.
*H01L 33/16* (2010.01)
(52) U.S. Cl. .................... 257/59; 257/72; 257/E33.003; 257/E33.004
(58) Field of Classification Search ......................... None
See application file for complete search history.

(56) References Cited

U.S. PATENT DOCUMENTS

| | | | |
|---|---|---|---|
| 5,408,252 A | 4/1995 | Oki et al. | |
| 5,745,194 A * | 4/1998 | Nakashima et al. | 349/38 |
| 6,204,912 B1 * | 3/2001 | Tsuchiya et al. | 355/53 |
| 6,831,295 B2 * | 12/2004 | Tsubo | 257/48 |
| 6,858,867 B2 * | 2/2005 | Okumura | 257/59 |
| 7,038,241 B2 * | 5/2006 | Okumura | 257/59 |
| 7,268,839 B2 * | 9/2007 | Cho et al. | 349/43 |
| 2008/0231779 A1 * | 9/2008 | Shin et al. | 349/106 |

FOREIGN PATENT DOCUMENTS

JP  6-27488  2/1994

OTHER PUBLICATIONS

W.B. Jackson et.al. "High-performance flexible zinc tin oxide field-effect transistors", Appl. Phys. Lett. 87, 193503 (2005).*

* cited by examiner

*Primary Examiner* — Thomas L Dickey
*Assistant Examiner* — Joseph Schoenholtz
(74) *Attorney, Agent, or Firm* — Antonelli, Terry, Stout & Kraus, LLP.

(57) ABSTRACT

Provided is a display device including first and second gate interconnections; a first pixel circuit disposed at one side of the first gate interconnection, the first pixel circuit including a first transistor, a gate electrode of the first transistor electrically connected to the first gate interconnection, a source electrode of the first transistor formed in a source layer, the source electrode including a first source electrode facing portion overlapping with the gate electrode; and a second pixel circuit disposed at the other side of the second gate interconnection, the second pixel circuit including a second transistor, a gate electrode of the second transistor electrically connected to the second gate interconnection, a source electrode of the second transistor formed in the source layer, the source electrode including a second source electrode facing portion overlapping with the gate electrode and stretched along the first source electrode facing portion.

6 Claims, 12 Drawing Sheets

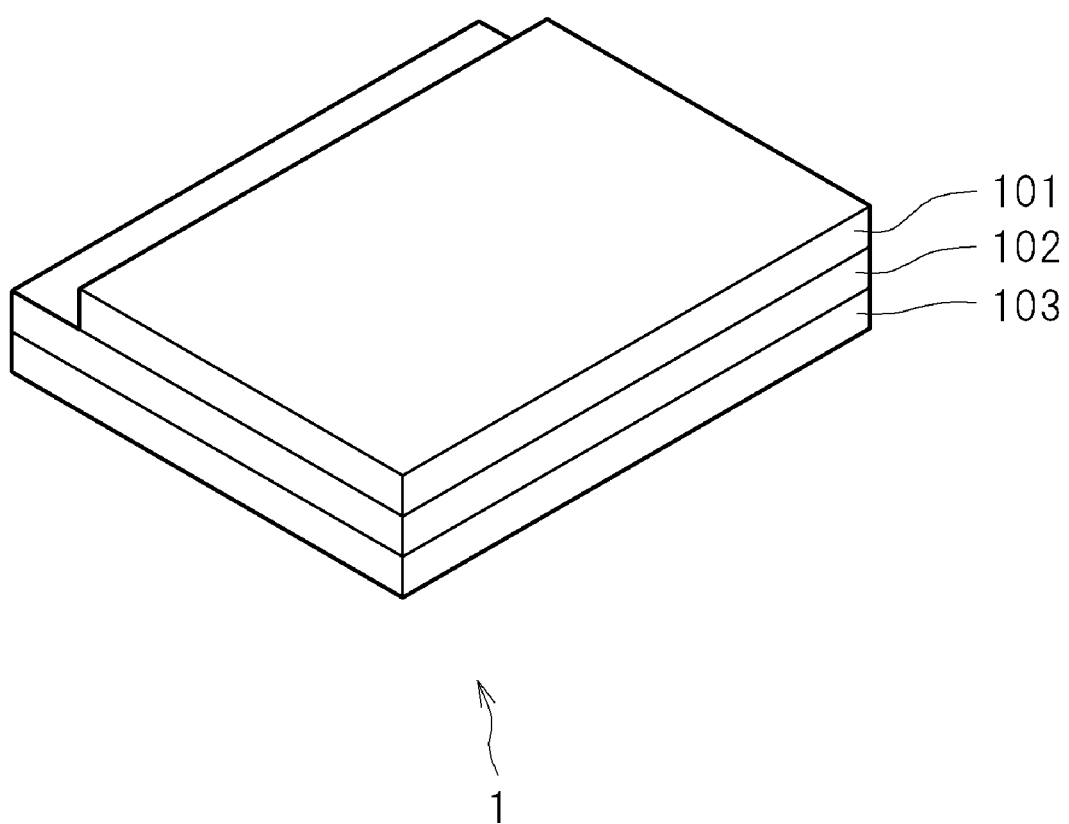

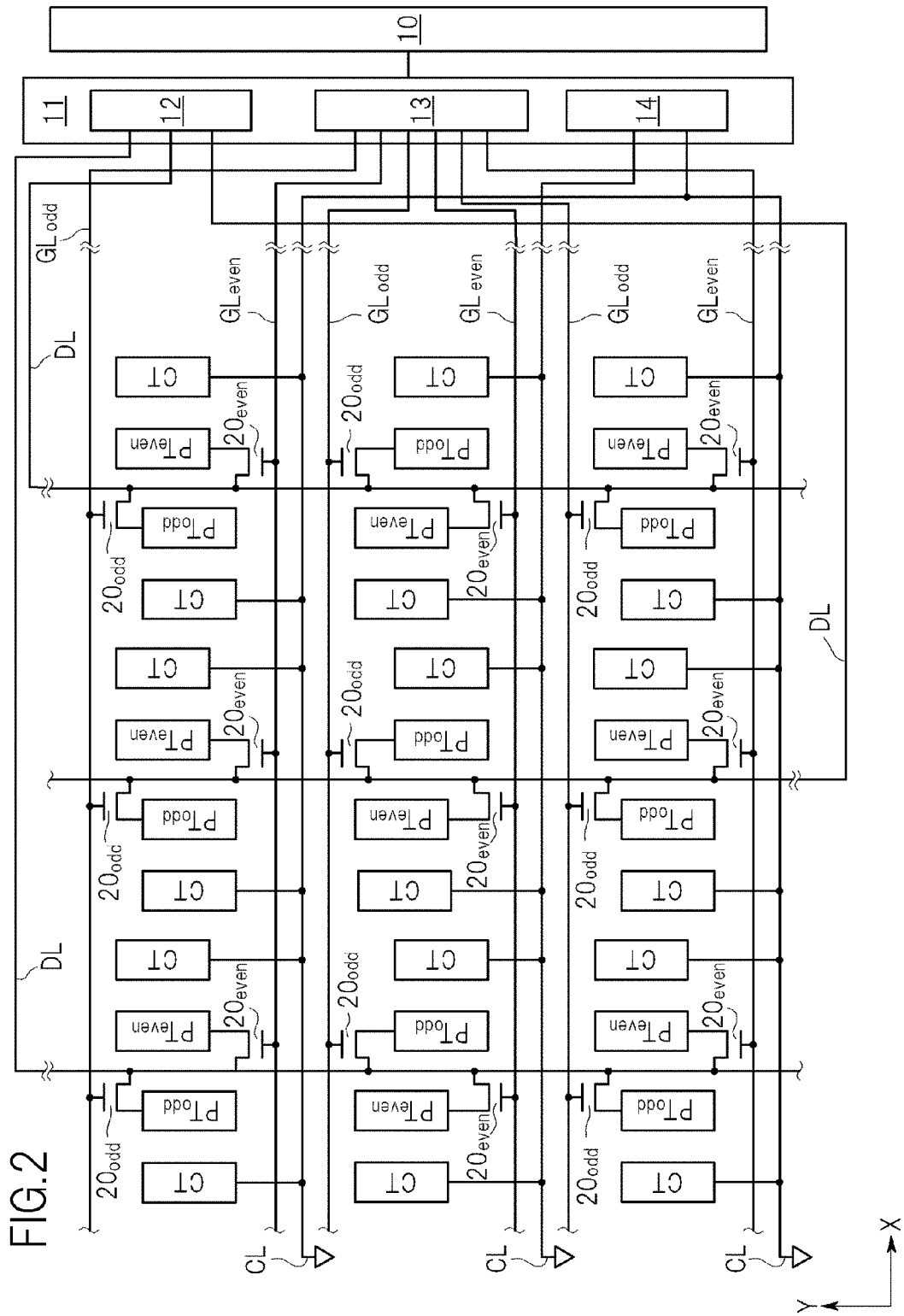

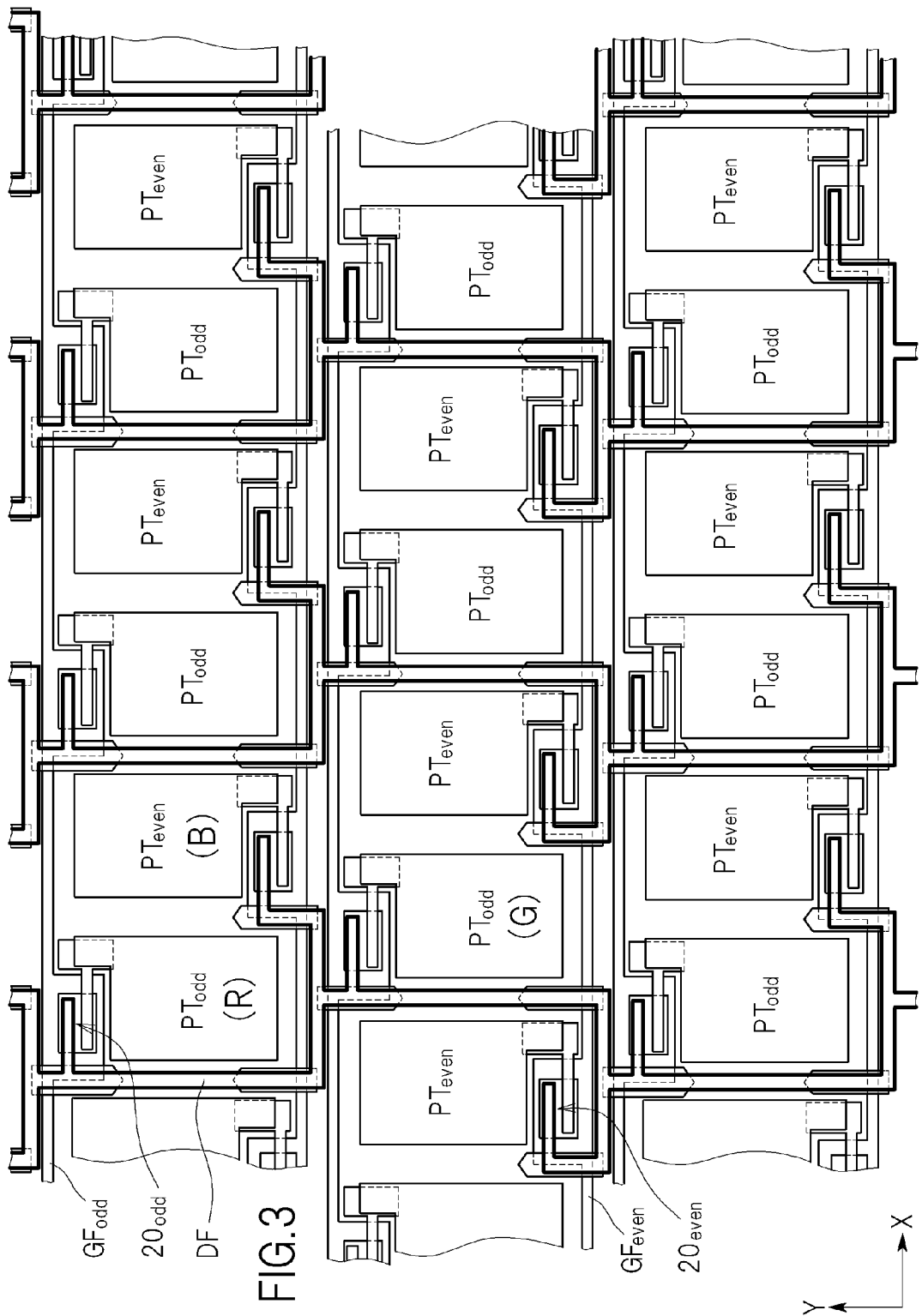

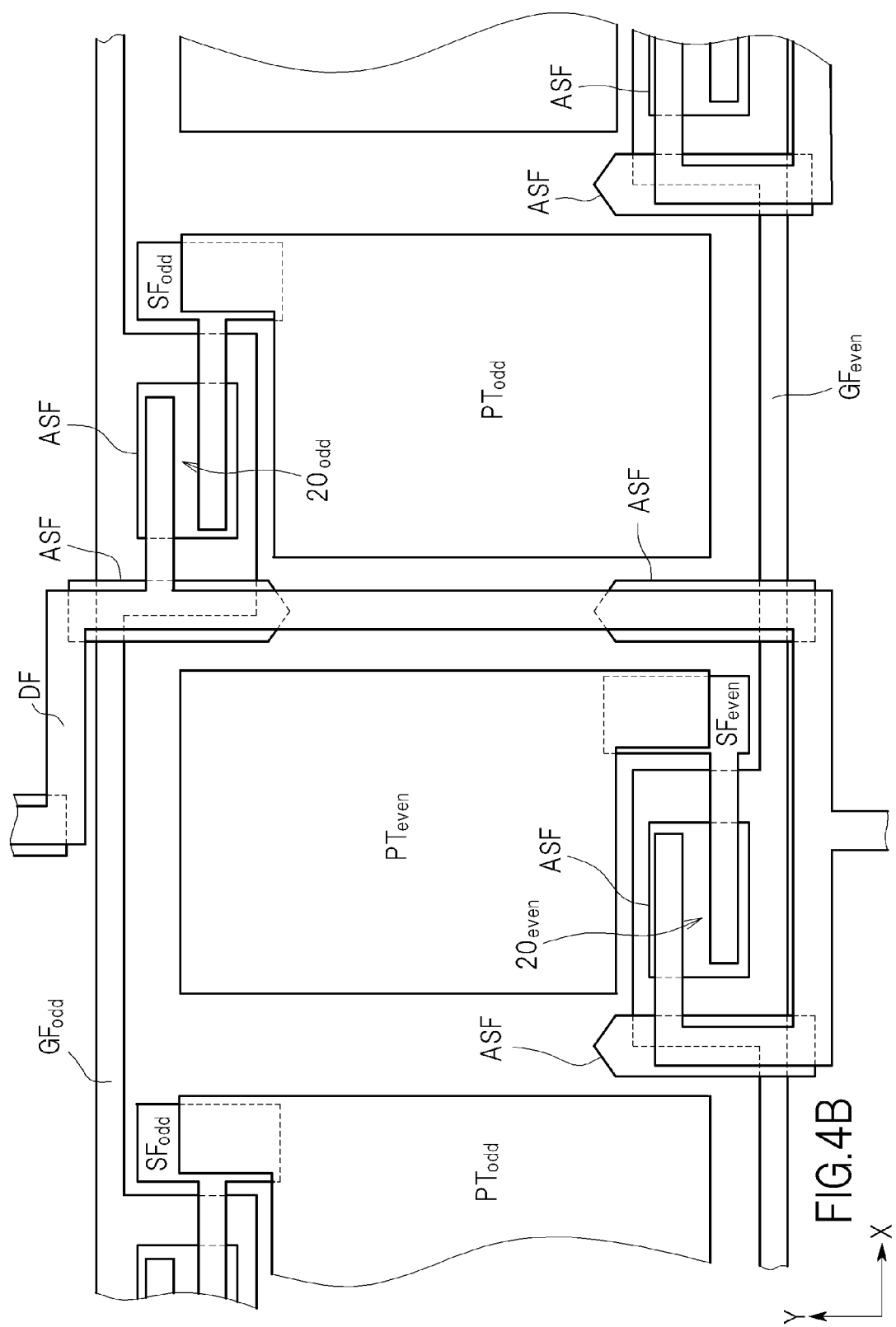

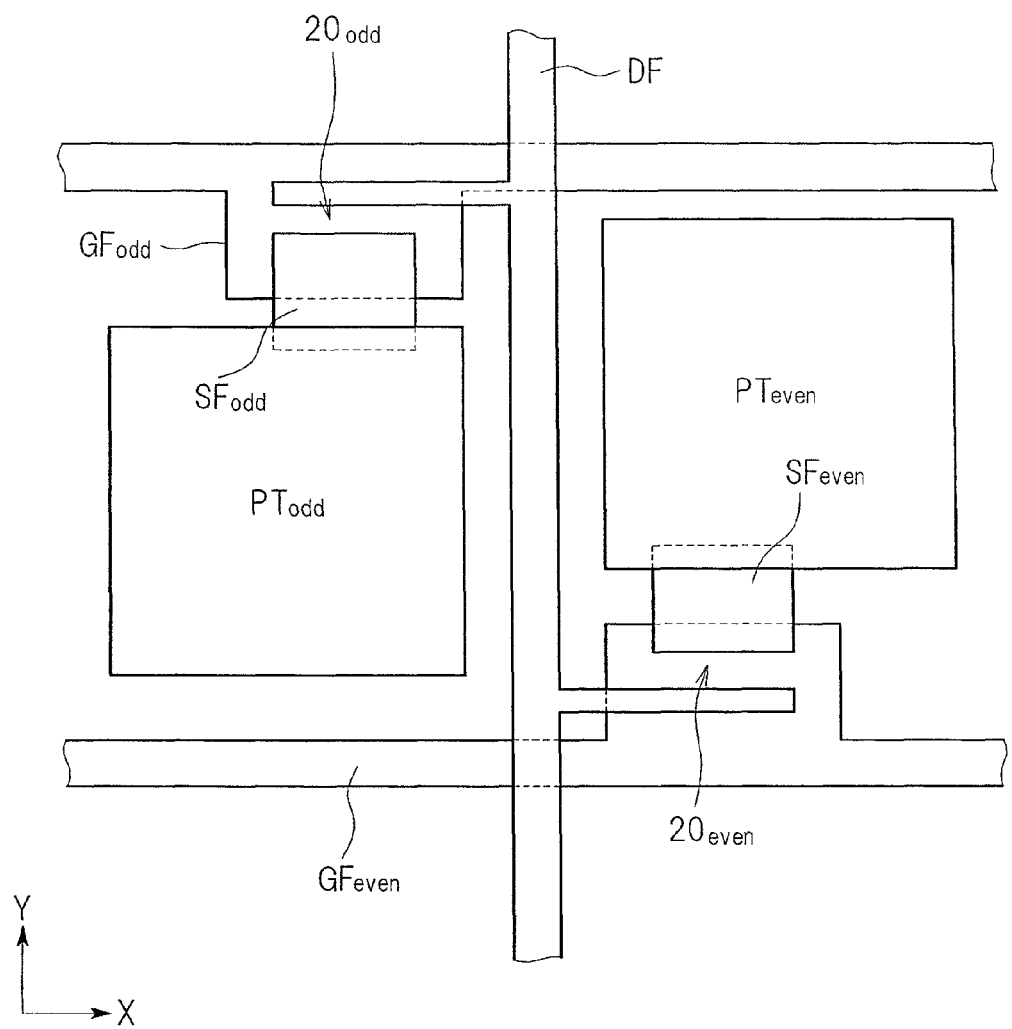

DISPLAY DEVICE

CROSS-REFERENCE TO RELATED APPLICATION

The present application claims priority from Japanese patent application JP 2010-037720 filed on Feb. 23, 2010, the content of which is hereby incorporated by reference into this application.

BACKGROUND OF THE INVENTION

1. Field of the Invention

The present invention relates to a display device. Particularly, the invention relates to a display device that improves a display quality by suppressing a variation in parasitic capacitance of a transistor provided in each of plural pixel circuits.

2. Description of the Related Art

In a display device having plural pixel circuits arranged on a display panel, a gate electrode of a transistor as a switching element provided in each pixel circuit is connected to a scanning signal line, and an input side of the transistor is connected to a data signal line. A high voltage is selectively applied to the gate electrode of the transistor via the scanning signal line. A display control voltage in accordance with display data of the pixel circuit is supplied to the pixel circuit from the data signal line during a time when the high voltage is applied to the gate electrode of the transistor, so that an image display on the display panel is controlled.

In general, the plural pixel circuits are arranged in a matrix pattern on a display area of the display panel, one scanning signal line is disposed to be stretched in the transverse direction along with the plural pixel circuits arranged in one row in the transverse direction, and one data signal line is disposed to be stretched in the longitudinal direction along with the plural pixel circuits arranged in one column in the longitudinal direction. However, for example, various structures may be supposed on the ground that a space of a frame area of the display panel is restricted.

For example, when an upper or lower space in the longitudinal direction is restricted in the frame area of the display panel, two scanning signal lines are respectively disposed to be stretched in the transverse direction along with the upper and lower sides of the plural pixel circuits arranged in one row in the transverse direction, and the two scanning signal lines are respectively and alternately connected to the plural pixel circuits arranged in the one row. Then, one data signal line is disposed to be stretched in the longitudinal direction for every two pixel circuits in the plural pixel circuits arranged in the one row, and is connected to two pixel circuits located on both sides of the data signal line.

In this case, the number of the scanning signal lines is twice the number of the scanning signal lines provided in the general display device, but the number of the data signal lines is a half of the number of the data signal lines provided in the general display device. Further, JP 6027488A discloses a technology related to the display device in which the scanning signal line and the data signal line are disposed with respect to the plural pixel circuits as described above.

SUMMARY OF THE INVENTION

FIG. 10 is a diagram illustrating a configuration of a display area of a liquid crystal display device according to the related art. Plural pixel circuits are arranged on a display area of a display panel. Each pixel circuit includes a thin film transistor (hereinafter, referred to as a TFT) 20 which is a switching element, where a gate electrode of the TFT 20 is connected to a scanning signal line GL, a drain electrode of the TFT 20 is connected to a data signal line DL, and a source electrode of the TFT 20 is connected to a pixel electrode PT provided in the pixel circuit.

As shown in the drawing, two scanning signal lines GL are disposed with respect to the plural pixel circuits arranged in one row in the transverse direction (X direction) of the drawing, and the two scanning signal lines GL are alternately connected to the gate electrodes of the TFTs 20 respectively provided in the plural pixel circuits arranged in the one row in the transverse direction of the drawing. Further, a data signal line DL is disposed for every two pixel circuits with respect to plural pixel circuits arranged in the one row in the transverse direction of the drawing, and the data signal line DL is connected to the drain electrodes of the TFTs 20 respectively provided in two pixel circuits disposed on both sides of the data signal line DL.

Here, the scanning signal line GL disposed at the upper side of the plural pixel circuits in each row is set as an odd scanning signal line $GL_{odd}$, and the scanning signal line GL disposed at the lower side thereof is set as an even scanning signal line $GL_{even}$. Further, the pixel circuit connected to the odd scanning signal line $GL_{odd}$, the TFT 20 provided in the pixel circuit, and the pixel electrode PT provided in the pixel circuits are respectively set as an odd pixel circuit, an odd TFT $20_{odd}$, and an odd pixel electrode $PT_{odd}$. The pixel circuit connected to the even scanning signal line $GL_{even}$, the TFT 20 provided in the pixel circuit, and the pixel electrode PT provided in the pixel circuit are respectively set as an even pixel circuit, an even TFT $20_{even}$, and an even pixel electrode $PT_{even}$.

FIG. 11A is a plan view illustrating a structure of two pixel circuits of the liquid crystal display device according to the related art. FIG. 11A shows, for example, two pixel circuits disposed at the first and second locations from the left side in the first row from the upper side of FIG. 10.

As shown in FIG. 11A, the scanning signal line GL and the gate electrode of the TFT 20 are actually formed on the same film, and this film is set as a gate electrode film GF. Here, the gate electrode film GF including the odd scanning signal line $GL_{odd}$ and the gate electrode of the odd TFT $20_{odd}$ is set as an odd gate electrode film $GL_{odd}$. The gate electrode film GF including the even scanning signal line $GL_{even}$ and the gate electrode of the even TFT $20_{even}$ is set as an even gate electrode film $GF_{even}$.

A gate isolation film (not shown) is formed throughout the upper side of the gate electrode film GF, and a silicon semiconductor film ASF (not shown) is formed in a predetermined area to cover the gate electrode of the TFT 20. Further, a drain electrode film DF and a source electrode film SF are formed on the upper side of the silicon semiconductor film ASF.

As shown in FIG. 11A, the data signal line DL and the drain electrode of the TFT 20 is formed on the drain electrode film DF. The source electrode film SF includes an area overlapping with the gate electrode film GF in the plan view to serve as a source electrode and an area broadening outward the gate electrode film GF. Then, the pixel electrode PT is formed to be electrically connected to the source electrode film.

Here, the source electrode film SF including the source electrode of the odd TFT $20_{odd}$ and the pixel electrode PT connected to the odd TFT $20_{odd}$ are respectively set as an odd source electrode film $SF_{odd}$ and an odd pixel electrode $PT_{odd}$. The source electrode film SF including the source electrode of the even TFT $20_{even}$ and the pixel electrode PT connected to the even TFT $20_{even}$ are respectively set as an even source electrode film $SF_{even}$ and an even pixel electrode $PT_{even}$.

As described above, the liquid crystal display device according to the related art has been described by referring to FIGS. 10 and 11A. In fact, when image display is performed by the liquid crystal display device shown in FIG. 10, a pixel voltage applied between the odd pixel electrode $PT_{odd}$ and a common electrode (not shown) causes a systematic error from a pixel voltage applied between the even pixel electrode $PT_{even}$ and the common electrode, which leads to an regular abnormal display (stripe irregularity). According to the examination of the inventors, the regular abnormal display generated in the odd pixel circuit and the even pixel circuit due to the following reasons is considered from the viewpoint of parasitic capacitance generated in the pixel circuit.

FIG. 12 is a circuit diagram illustrating parasitic capacitance of the pixel circuit of the liquid crystal display device shown in FIG. 11A. The gate electrode and the source electrode of the TFT 20 overlap with each other in the plan view with the gate isolation film and the silicon semiconductor film interposed therebetween, and parasitic capacitance Cgs is present between the gate electrode and the source electrode of the TFT 20. Also, parasitic capacitance Css is present between the adjacent pixel electrodes PT. The pixel voltage applied between the pixel electrode PT and the common electrode is influenced by the parasitic capacitances Cgs and Css.

The parasitic capacitance Css present between the adjacent pixel electrodes PT is dependent on the distance between the adjacent pixel electrodes PT. On the contrary, the parasitic capacitance Cgs present between the gate electrode and the source electrode of the TFT 20 is dependent on an area where the gate electrode and the source electrode face each other with the gate isolation film and the silicon semiconductor film interposed therebetween.

As for two pixel circuits of the liquid crystal display device according to the related art shown in FIG. 11A, the odd pixel circuit and the even pixel circuit are symmetrical to each other, and there is no difference in parasitic capacitances Cgs and Css in the odd pixel circuit and the even pixel circuit. That is, the area where the gate electrode and the source electrode of the TFT 20 face each other (overlap with each other in the plan view) is the same between the odd pixel circuit and the even pixel circuit, and there is no difference in parasitic capacitance Cgs. Also, the combination of two parasitic capacitances Css generated between the even pixel electrodes $PT_{even}$ located at both sides of the odd pixel electrode $PT_{odd}$ and the combination of two parasitic capacitances Css generated between the odd pixel electrodes $PT_{odd}$ located at both sides of the even pixel electrode $PT_{even}$ are equal to each other, and there is no difference in combination of two parasitic capacitances Css.

However, as described above, the TFT 20 and the pixel electrode PT is formed as a multi-structure, and manufacturing errors occur when forming the respective layers. The shapes of the gate electrode film GF, the drain electrode film DF, the source electrode film SF, and the pixel electrode PT are formed by selective etching using photolithography, for example. However, a positional deviation occurs when a pattern of etching using photolithography is formed, so that a positional deviation occurs in each layer.

When a positional deviation occurs upon forming the gate electrode film GF and the source electrode film SF, manufacturing errors occur in the area where the gate electrode and the source electrode of the TFT 20 face each other, and errors occur in parasitic capacitance Cgs generated between the gate electrode and the source electrode of the TFT 20. On the contrary, since the adjacent pixel electrodes PT are simultaneously formed by an etching pattern, manufacturing errors hardly occur in the distance between the adjacent pixel electrodes PT.

FIG. 11B is a plan view illustrating another example of a structure of two pixel circuits of the liquid crystal display device according to the related art. Although the liquid crystal display device is designed to have the structure of the two pixel circuits shown in FIG. 11A, the gate electrode film GF is manufactured at a position deviating downward in the drawing with respect to the drain electrode film DF and the source electrode film SF.

That is, since the odd gate electrode film $GF_{odd}$ shown at the upper side of the drawing deviates downward in the drawing with respect to the drain electrode film DF and the odd source electrode film $SF_{odd}$, the area where the gate electrode and the source electrode of the odd TFT $20_{odd}$ face each other increases more than the area shown in FIG. 11A. On the contrary, since the even gate electrode film $GF_{even}$ shown at the lower side of the drawing deviates downward in the drawing with respect to the drain electrode film DF and the even source electrode film $SF_{even}$, the area where the gate electrode and the source electrode of the even TFT $20_{even}$ face each other more decreases than the area shown in FIG. 11A.

When the parasitic capacitances Cgs generated between the gate electrode and the source electrode of each of the odd TFT $20_{odd}$ and the even TFT $20_{even}$ are respectively set as odd parasitic capacitance $Cgs_{odd}$ and even parasitic capacitance $Cgs_{even}$, odd parasitic capacitance $Cgs_{odd}$ increases and even parasitic capacitance $Cgs_{even}$ decreases due to a positional deviation generated when manufacturing the device in the case shown in FIG. 11B.

In the case of the liquid crystal display device of the related art, the parasitic capacitances Cgs present in the odd pixel circuit and the even pixel circuit may systematically change such that one of the parasitic capacitances increases when the other thereof decreases due to manufacturing errors. A pixel voltage applied between the pixel electrode PT and the common electrode upon writing display data decreases in accordance with the parasitic capacitance Cgs upon displaying an image. However, even when it is designed to have the same parasitic capacitance Cgs between the odd pixel circuit and the even pixel circuit, systematic errors occur in the odd parasitic capacitance $Cgs_{odd}$ and the even parasitic capacitance $Cgs_{even}$ due to manufacturing errors, so that a systematic difference occurs by a reduction degree of the pixel voltage. This is one of reasons that cause a regular abnormal display.

The invention is made in view of such circumstances, and provides a display device capable of suppressing an abnormal display by suppressing systematic errors of parasitic capacitance caused by manufacturing errors and improving a display quality.

(1) In order to solve the above-described problem, according to an aspect of the invention, there is provided a display device including: first and second gate interconnections extending along with each other; a first pixel circuit being disposed at one side of the first gate interconnection, the first pixel circuit including a first transistor, a gate electrode of the first transistor being formed in a gate electrode layer and being electrically connected to the first gate interconnection, a source electrode of the first transistor being formed in a source electrode layer, the source electrode of the first transistor including a first source electrode facing portion overlapping with the gate electrode of the first transistor in the plan view; and a second pixel circuit being disposed at the other side of the second gate interconnection, the second pixel circuit including a second transistor, a gate electrode of the second transistor being formed in the gate electrode layer and being electrically connected to the second gate interconnection, a source electrode of the second transistor being formed in the source electrode layer, the source electrode of the second transistor including a second source electrode facing portion overlapping with the gate electrode of the second transistor in the plan view and being stretched along the first source electrode facing portion.

(2) In the display device according to (1), the first source electrode facing portion may be stretched in a predetermined direction.

(3) In the display device according to (1), the first source electrode facing portion may be stretched in the direction along with the first gate interconnection.

(4) In the display device according to (3), the length of the first source electrode facing portion in the stretching direction may be longer than the width of the first source electrode facing portion, and the length of the second source electrode facing portion in the stretching direction may be longer than the width of the second source electrode facing portion.

(5) In the display device according to any one of (1) to (4), a drain electrode of the first transistor may include a first drain electrode facing portion which overlaps with the gate electrode of the first transistor in the plan view and is stretched in the reverse direction of the stretching direction of the first source electrode facing portion, and a drain electrode of the second transistor may include a second drain electrode facing portion which overlaps with the gate electrode of the second transistor in the plan view and is stretched along the first drain facing portion.

(6) The display device according to (5) may further includes: a data signal interconnection being electrically connected to the drain electrode of the first transistor, the data signal interconnection being branched and extending to the drain electrode of the first transistor.

(7) In the display device according to (5), the drain electrode of the second transistor may be disposed with respect to the source electrode of the second transistor in accordance with the arrangement of the first drain electrode with respect to the source electrode of the first transistor.

According to the invention, a display device may be provided which suppresses an abnormal display by suppressing systematic errors of parasitic capacitance caused by manufacturing errors and improves a display quality.

BRIEF DESCRIPTION OF THE DRAWINGS

FIG. 1 is an entire perspective view illustrating a liquid crystal display device according to an first embodiment of the invention.

FIG. 2 is a diagram illustrating an equivalent circuit of a TFT substrate of the liquid crystal display device according to the first embodiment of the invention.

FIG. 3 is a diagram illustrating a configuration of a display area of the liquid crystal display device according to the first embodiment of the invention.

FIG. 4B is a plan view illustrating another example of a structure of two pixel circuits of the liquid crystal display device according to the first embodiment of the invention.

FIG. 11B is a plan view illustrating another example of a structure of two pixel circuits of the liquid crystal display device according to the related art.

DETAILED DESCRIPTION OF THE INVENTION

Figure 4A:
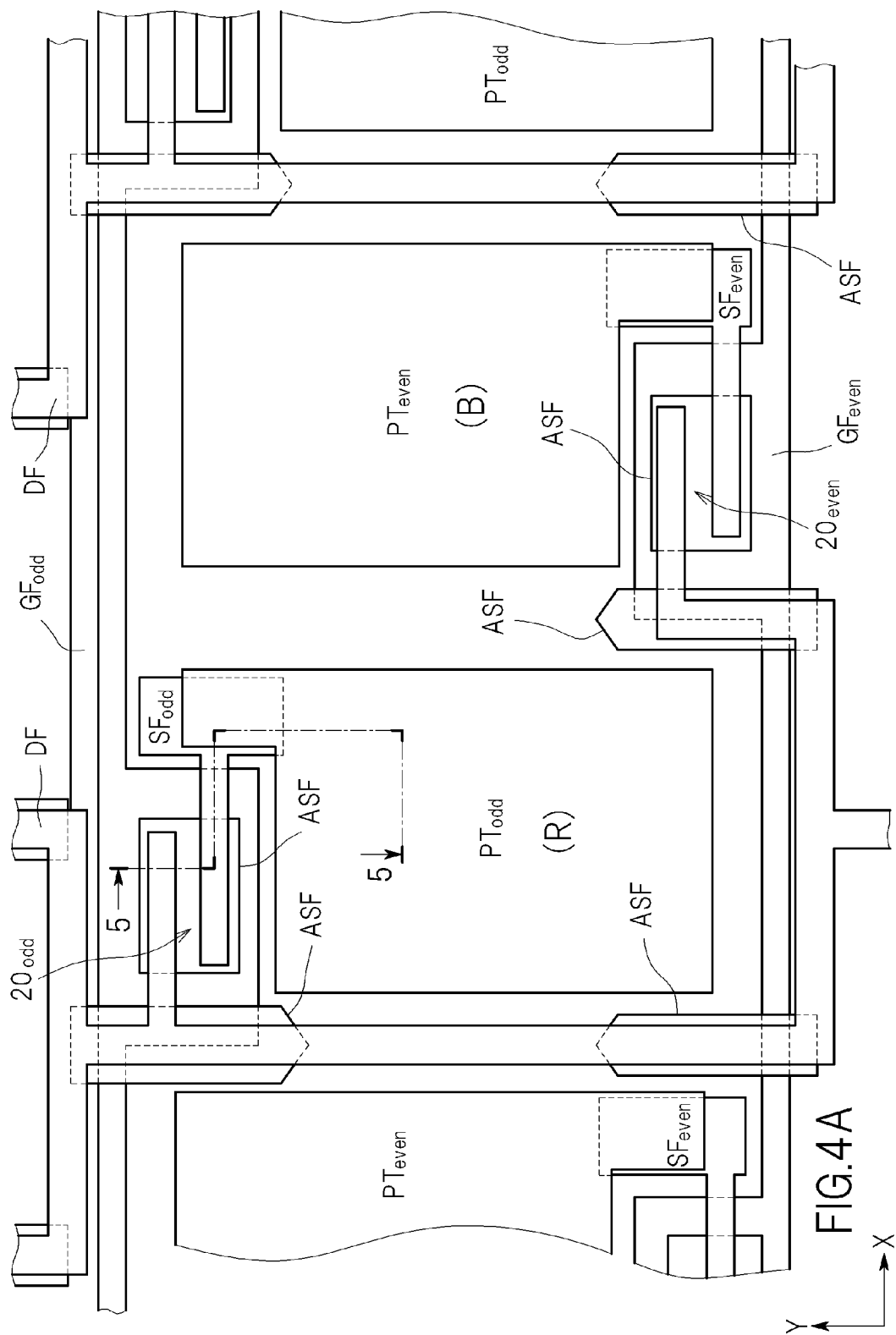
FIG. 4A is a plan view illustrating a structure of two pixel circuits of the liquid crystal display device according to the first embodiment of the invention.

Hereinafter, a display device according to embodiments of the invention will be described in detail below. However, the drawings below are merely used to illustrate examples of each embodiment, and the size of the drawing and the scale of the embodiment may be different.

[First Embodiment]

A display device according to a first embodiment of the invention is a certain type of liquid crystal display device 1 in an IPS (In-Plane Switching) liquid crystal display device. FIG. 1 is an entire perspective view illustrating the liquid crystal display device 1 according to the first embodiment of the invention. As shown in FIG. 1, the liquid crystal display device 1 includes: a TFT substrate 102; a filter substrate 101 which faces the TFT substrate 102 and has a color filter formed thereon; a liquid crystal material which is enclosed in an area interposed between both the substrates; a backlight 103 which is located at the side of the TFT substrate 102; and a flexible substrate (not shown) which supplies various control signals to the TFT substrate 102. The TFT substrate 102 has a structure in which TFTs and the like are disposed on a transparent substrate such as a glass substrate.

FIG. 2 is a diagram illustrating an equivalent circuit of the TFT substrate 102 of the liquid crystal display device 1 according to the first embodiment of the invention.

A connector 10 connected to the flexible substrate is shown at the right side of FIG. 2, and as described above, various control signals and the like necessary for an image display are supplied from the flexible substrate to the TFT substrate 102 via the connector 10. The TFT substrate 102 includes a control circuit 11, and the control signals generated from the flexible substrate are input to the control circuit 11. The control circuit 11, which is a controller drive IC integrated on one chip, includes, for example, a data signal driving circuit 12, a scanning signal driving circuit 13, a reference voltage supply circuit 14, and the like. Further, plural pixel circuits are regularly disposed on the TFT substrate 102, and each pixel circuit includes a TFT 20 as a switching element, a pixel electrode PT, a reference electrode CT, and the like.

Plural data signal lines DL (data signal interconnections) extend from the data signal driving circuit 12 provided in the control circuit 11 to the plural pixel circuits provided in a display area of the TFT substrate 102, plural scanning signal lines GL (gate interconnections) extend from the scanning signal driving circuit 13 to the plural pixel circuits, and plural reference voltage lines CL extend from the reference voltage supply circuit 14 to the plural pixel circuits. In the display area having the plural pixel circuits, the scanning signal lines GL extend in the transverse direction (X direction), and the data signal lines DL extend in the longitudinal direction (Y direction).

As shown in the drawing, two scanning signal lines GL are disposed for the plural pixel circuits arranged in one row in the transverse direction (X direction) in the drawing, and the two scanning signal lines GL are alternately and electrically connected to the gate electrodes of the TFTs 20 of the plural pixel circuits arranged in the one row in the transverse direction of the drawing. Further, in the plural pixel circuits arranged in the one row in the transverse direction in the drawing, the data signal line DL is provided every two pixel circuits, and the data signal line DL is connected to the drain electrodes of the TFTs 20 of two pixel circuits disposed on the side of the data signal line DL. The source electrode of the TFT 20 is connected to the pixel electrode PT. Here, for the convenience of description, the electrode disposed at the input side of the TFT 20 and connected to the data signal line DL will be referred to as a drain electrode, and the electrode disposed at the output side of the TFT 20 and connected to the pixel electrode PT will be referred to as a source electrode.

Further, as shown in the drawing, a part of the data signal lines DL in the plural data signal lines DL extend from the data signal driving circuit 12 disposed at the right side of the drawing via a frame area disposed on the upper side of the display area, and extend from the upper end of the display area downward in the drawing to the corresponding pixel circuits. The rest of the data signal lines DL extend from the data signal driving circuit 12 via a frame area disposed on the lower side of the display area, and extend from the lower end of the display area upward in the drawing to the corresponding pixel circuits.

Figure 10:
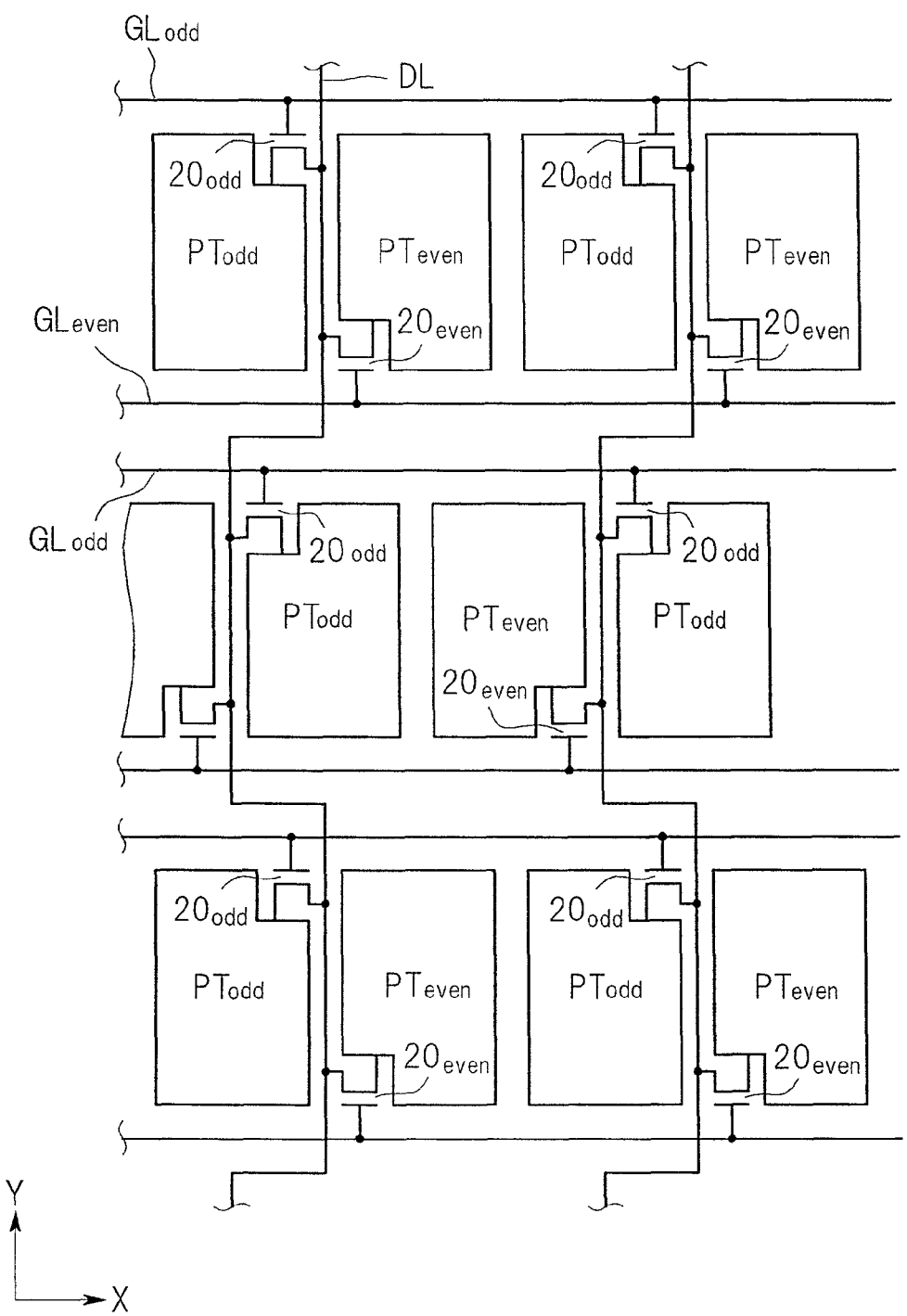
FIG. 10 is a diagram illustrating a configuration of a display area of a liquid crystal display device according to the related art.

Here, as in FIG. 10, each of the scanning signal lines GL disposed at the lower side of the plural pixel circuits of each row will be set as an even scanning signal line $GL_{even}$ (first gate interconnection), and each of the scanning signal lines GL disposed at the upper side of the plural pixel circuits of each row will be set as an odd scanning signal line $GL_{odd}$ (second gate interconnection). That is, the upper side (one side) of the even scanning signal line $GL_{even}$ has a pixel circuit connected to the even scanning signal line $GL_{even}$, and this pixel circuit will be set as an even pixel circuit (first pixel circuit). The lower side (the other side) of the odd scanning signal line $GL_{odd}$ has a pixel circuit connected to the odd scanning signal line $GL_{odd}$, and this pixel circuit will be set as an odd pixel circuit (second pixel circuit). Further, the TFT 20 and the pixel electrode PT provided in the even pixel circuit will be respectively set as an even TFT $20_{even}$ (first transistor) and an even pixel electrode $PT_{even}$. The TFT 20 and the pixel electrode PT provided in the odd pixel circuit will be respectively set as an odd TFT $20_{odd}$ (second transistor) and an odd pixel electrode $PT_{odd}$.

The data signal line DL is connected to the drain electrodes of the TFTs 20 of two pixel circuits disposed on the side of the data signal line DL in the plural pixel circuits arranged in each row, and extends in the longitudinal direction (Y direction) in the drawing. Further, the plural pixel circuits disposed at the first and third row from the upper side of the drawing are sequentially disposed from the left side in an order of the odd pixel circuit, the even pixel circuit, and the odd pixel circuit. However, the plural pixel circuits disposed at the second row from the upper side of the drawing are sequentially disposed from the left side in an order of the even pixel circuit, the odd pixel circuit, and the even pixel circuit. That is, in the plural pixel circuits disposed in each row, two pixel circuits connected to one data signal line DL are disposed in an order of the odd pixel circuit and the even pixel circuit with inverting the circuits in the longitudinal direction of the drawing.

Further, one reference voltage line CL is disposed on the lower side of the drawing for the plural pixel circuits arranged in the one row in the transverse direction of the drawing, and the one reference voltage line CL is connected to the reference electrodes CT of the plural pixel circuits arranged in the one row in the transverse direction of the drawing.

In the above-described circuit configuration, a reference voltage is applied to the reference electrode CT of each pixel circuit via the reference voltage line CL. Further, a gate voltage is applied to the scanning signal line GL, and a current flowing to the TFT 20 is controlled. When a high voltage is applied to the gate electrode of the TFT 20 via the scanning signal line GL, the TFT 20 is turned on. While the TFT 20 is turned on, a display data voltage supplied to the corresponding data signal line DL is supplied to the corresponding pixel electrode PT via the TFT 20. Accordingly, the alignment or the like of the liquid crystal molecules provided in the corresponding pixel circuit are controlled, thereby displaying an image.

FIG. 3 is a diagram illustrating a configuration of a display area of the liquid crystal display device 1 according to the first embodiment of the invention. The plural pixel circuits are disposed in the display area of the display panel. As described above, each pixel circuit includes the TFT 20, the pixel electrode PT, and the reference electrode CT (not shown). In the plural pixel circuits arranged in each row in the transverse direction (X direction) of the drawing, the even scanning signal line $GL_{even}$ and the odd scanning signal line $GL_{odd}$ are disposed along with the plural pixel circuits arranged in each row. In the drawing, the even scanning signal line $GL_{even}$ and the odd scanning signal line $GL_{odd}$ are respectively shown as an even gate electrode film $GF_{even}$ and an odd gate electrode film $GF_{odd}$.

Further, the data signal line DL is connected to the drain electrodes of the TFTs 20 of two pixel circuits in the plural pixel circuits arranged in each row, and extends in the longitudinal direction (Y direction) of the drawing. In the drawing, the data signal line DL and the drain electrode are shown as a drain electrode film DF. In FIG. 2, two pixel circuits connected to the data signal line DL are disposed on both sides of the data signal line DL. However, as shown in FIG. 3, in the plural pixel circuits arranged at the first and third rows from the upper side of the drawing, two pixel circuits connected to the data signal line DL are disposed at the right side of the data signal line DL. On the contrary, in the plural pixel circuits arranged at the second row from the upper side of the drawing, two pixel circuits connected to the data signal line DL are respectively disposed on both sides of the data signal line DL.

Further, in the plural pixel circuits arranged at the first and third rows from the upper side of the drawing, two pixel circuits connected to the data signal line DL are sequentially arranged from the left side of the drawing in an order of the odd pixel circuit and the even pixel circuit. On the contrary, in the plural pixel circuits arranged at the second row from the upper side of the drawing, two pixel circuits connected to the data signal line DL are sequentially arranged from the left side of the drawing in an order of the even pixel circuit and the odd pixel circuit. As described above, the pixel circuits arranged at the first and third rows from the upper side of the drawing and the pixel circuits arranged at the second row from the upper side of the drawing have different structures. This different structure will be described later.

When a color image is displayed, three colors of display dots are generally displayed as one pixel. As for the arrangement of three colors of display dots, a stripe arrangement sequentially arranging the display dots in the transverse direction, a delta arrangement where connecting the centers of three colors of display dots assume a shape of triangle, or the like may be exemplified. The plural pixel circuits shown in FIG. 3 are arranged in a delta arrangement. For example, the pixel circuit disposed at the first location from the left side in the first row from the upper side of the drawing serves as a red display dot R, the pixel circuit disposed at the second location serves as a blue display dot B, and the pixel circuit disposed at the second location from the left side in the second row from the upper side of the drawing serves as a green display dot G, where the three pixel circuits form one pixel. Here, when counting the first and second locations, the pixel circuit in which a part of the pixel electrode PT is shown in the drawing is not included. The same applies hereinafter.

Since the plural pixel circuits are arranged in a delta arrangement, the plural pixel circuits arranged at a certain row and the plural pixel circuits arranged at the adjacent row are disposed to be deviated from each other in the transverse direction. For example, in the plural pixel circuits shown in FIG. 3, the plural pixel circuits arranged at the first and third rows from the upper side of the drawing and the plural pixel circuits arranged at the second row from the upper side of the drawing are disposed to be deviated from each other in the transverse direction by a distance substantially corresponding to a half of the pixel circuit. That is, the borders of two pixel circuits disposed adjacent to each other in the transverse direction in each row are different from each other in the transverse direction.

For this reason, the data signal line DL is stretched in the longitudinal direction between two pixel circuits disposed adjacent to each other in one row in the transverse direction, is bent between the rows to be stretched in the transverse direction, and is bent again to be stretched in the longitudinal direction between two pixel circuits disposed adjacent to each other in the transverse direction in the adjacent rows. By repeating this stretching, the data signal line DL is stretched in the longitudinal direction. That is, the data signal line DL has a portion that extends in the longitudinal direction of the drawing in a zigzag shape.

FIG. 4A is a plan view illustrating a structure of two pixel circuits of the liquid crystal display device 1 according to the first embodiment of the invention. FIG. 4A shows the pixel circuit (display dot R) disposed at the first location from the left side in the first row from the upper side of FIG. 3, and the pixel circuit (display dot G) disposed at the second location.

Figure 11A:
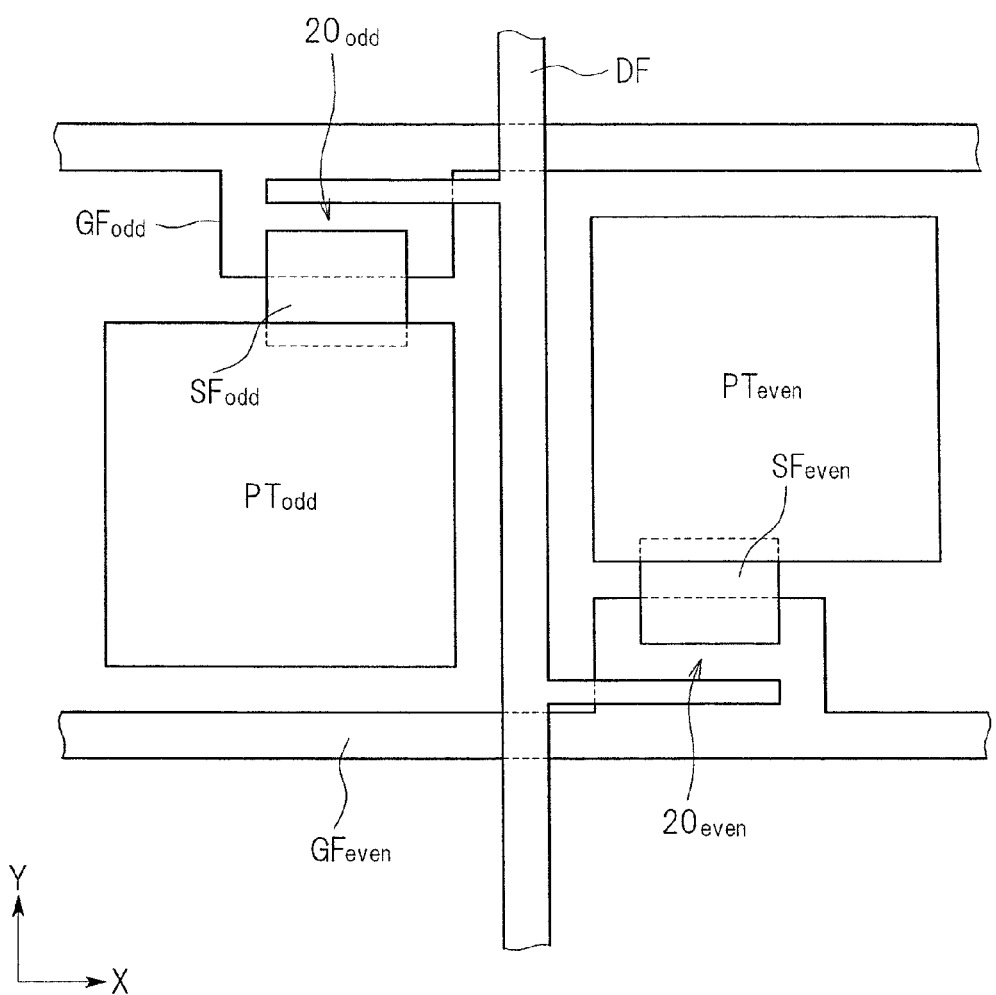
FIG. 11A is a plan view illustrating a structure of two pixel circuits of the liquid crystal display device according to the related art.
Figure 12:
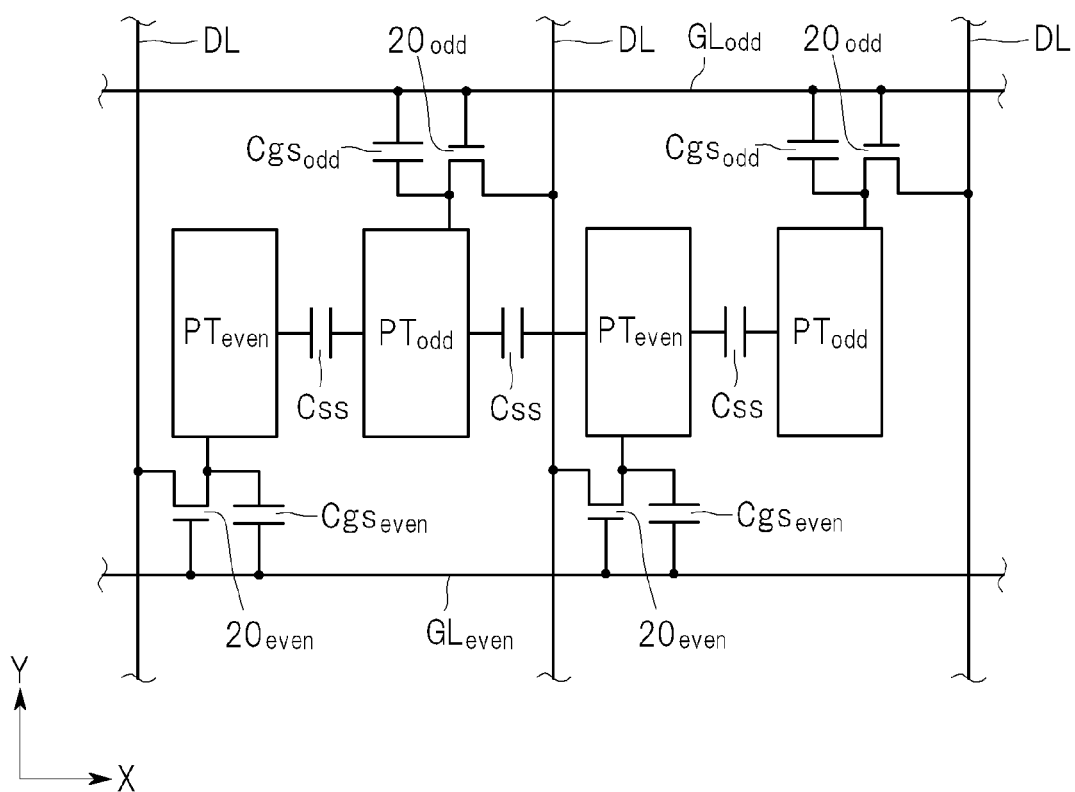
FIG. 12 is a circuit diagram illustrating parasitic capacitance of the pixel circuit of the liquid crystal display device according to the related art.

As in FIG. 11A or FIG. 11B, in fact, the scanning signal line GL and the gate electrode of the TFT 20 are formed on a gate electrode film GF as shown in FIG. 4A. That is, in the gate electrode film GF, the portion stretched in the transverse direction (X direction) of the drawing is the scanning signal line GL, and the portion protruding laterally from the portion serving as the scanning signal line GL is the gate electrode of the TFT 20. The gate electrode is formed in a rectangular shape, and the elongated direction of the rectangular shape is the transverse direction of the drawing. The gate electrode film GF including the even scanning signal line $GL_{even}$ and the gate electrode of the even TFT $20_{even}$ serves as an even gate electrode film $GF_{even}$, and the gate electrode film GF including the odd scanning signal line $GL_{odd}$ and the gate electrode of the odd TFT $20_{odd}$ serves as an odd gate electrode film $GF_{odd}$. In the even gate electrode film $GF_{even}$, the upper side of the even scanning signal line $GL_{even}$ is provided with the gate electrode of the even TFT $20_{even}$. In the odd gate electrode film $GF_{odd}$, the lower side of the odd scanning signal line $GL_{odd}$ is provided with the gate electrode of the odd TFT $20_{odd}$.

The upper side of the gate electrode film GF is provided with a gate isolation film 32 (not shown) formed on the entire surface. Further, a silicon semiconductor film ASF is formed in a predetermined area of the gate isolation film 32. Here, the predetermined area includes an area which is a part of an area serving as the gate electrode of the TFT 20, and an area which has a portion where the gate electrode film GF and the drain electrode film DF to be described later overlap with each other in the plan view via the gate isolation film 32.

The silicon semiconductor film ASF disposed at a part of an area serving as the gate electrode of the TFT 20 is formed in a rectangular shape which is stretched in the transverse direction of the drawing. The upper side of the silicon semiconductor film ASF is provided with the drain electrode film DF and a source electrode film SF via an impurity silicon semiconductor film 35 (not shown).

As shown in FIG. 4A, the source electrode film SF is stretched in the transverse direction of the drawing includes the source electrode of the TFT 20 which overlaps with the gate electrode film GF in the plan view, and a bonding portion which is bonded to the source electrode and is provided to ensure an electrical connection with the pixel electrode PT to be described later.

Here, the source electrode film SF including the source electrode of the even TFT $20_{even}$ will be set as an even source electrode film $SF_{even}$, and the source electrode film SF including the source electrode of the odd TFT $20_{odd}$ will be set as an odd source electrode film $SF_{odd}$. As shown in FIG. 4A, the bonding portion of the even source electrode film $SF_{even}$ is disposed at the right side of the even pixel circuit, and is formed in a rectangular shape in which the elongated direction is the longitudinal direction (Y direction) of the drawing. In the even source electrode film $SF_{even}$, the source electrode of the even TFT $20_{even}$ is stretched from the left side of the outer edge of the bonding portion leftward in the drawing to overlap with the gate electrode of the even TFT $20_{even}$ located at the lower position in the plan view. Here, the source electrode of the even TFT $20_{even}$ is formed in a rectangular shape in which the elongated direction is the transverse direction of the drawing. In the source electrode of the even TFT $20_{even}$, an area overlapping with the gate electrode of the even TFT $20_{even}$ located at the lower position will be referred to as a first source electrode facing portion.

The bonding portion of the odd source electrode film $SF_{odd}$ is disposed at the right side of the odd pixel circuit, and is formed in a rectangular shape in which the elongated direction is the longitudinal direction of the drawing. As in the source electrode of the even TFT $20_{even}$, the source electrode of the odd TFT $20_{odd}$ is stretched from the left side of the outer edge of the bonding portion leftward in the drawing to overlap with the gate electrode of the odd TFT $20_{odd}$ located at the lower position in the plan view. Here, the source electrode of the odd TFT $20_{odd}$ is formed in a rectangular shape in which the elongated direction is the transverse direction of the drawing. In the source electrode of the odd TFT $20_{odd}$, an area overlapping with the gate electrode of the odd TFT $20_{odd}$ located at the lower position in the plan view will be referred to as a second source electrode facing portion. Both of the first source electrode facing portion and the second source electrode facing portion are formed in a rectangular shape which is stretched from the bonding portion leftward in the drawing.

Then, as described above, the data signal line DL is connected to the drain electrodes of the TFTs 20 of two pixel circuits disposed at the right side of the data signal line DL. However, in fact, the data signal line DL and the drain electrodes of the TFTs 20 of two pixel circuits are formed on the drain electrode film DF as shown in FIG. 4A.

In the drain electrode film DF, the drain electrode of the TFT 20 is connected to the data signal line DL, and is stretched to the upper position of the gate electrode film of the TFT 20 included in the gate electrode film GF located at the lower position to overlap with the gate electrode in the plan view. As described below, both of the drain electrode of the even TFT $20_{even}$ and the drain electrode of the odd TFT $20_{odd}$ are formed in a rectangular shape in which the elongated direction is the transverse direction of the drawing.

In the drain electrode film DF, the data signal line DL is an area except for an area serving as the drain electrode of the TFT 20, and includes a primary data signal line portion and a secondary data signal line portion. The primary data signal line portion is stretched in the longitudinal direction of the drawing at the left side of two pixel circuits arranged in one row in the transverse direction of the drawing. However, the primary data signal line portion is bent in the transverse direction of the drawing between the plural pixel circuits arranged in the adjacent rows, is stretched in the transverse direction of the drawing by a distance substantially corresponding to a half of the pixel circuit, is bent again in the longitudinal direction of the drawing, and then is stretched in the longitudinal direction of the drawing. That is, as described above, the primary data signal line portion extends in the longitudinal direction of the drawing in a zigzag shape.

The primary data signal line portion is stretched from the left side rightward in the drawing at the lower side of the odd pixel circuit located at the left side of FIG. 4A, and is bent downward in the drawing to be stretched downward in the drawing. The secondary data signal line portion is stretched rightward in the drawing from the bent portion, is bent upward in the drawing at an area between two pixel circuits, and is stretched upward again in the drawing. Then, the secondary data signal line portion contacts the drain electrode of the even TFT $20_{even}$ of the even pixel circuit located at the right side of the drawing.

The drain electrode of the even TFT $20_{even}$ of the even pixel circuit located at the right side of the drawing is stretched rightward in the drawing from the front end of the secondary data signal line portion of the data signal line DL to overlap with the gate electrode of the odd TFT $20_{odd}$ located at the lower position in the plan view. In the drain electrode of the even TFT $20_{even}$, an area overlapping with the gate electrode of the even TFT $20_{even}$ located at the lower position in the plan view is set as a first drain electrode facing portion.

The drain electrode of the odd TFT $20_{odd}$ of the odd pixel circuit located at the left side of the drawing is stretched rightward in the drawing from the right side of the primary data signal line portion stretched in the longitudinal direction at the left side of the odd pixel circuit to overlap with the gate electrode of the odd TFT $20_{odd}$ located at the lower position in the plan view. In the drain electrode of the odd TFT $20_{odd}$, an area overlapping with the gate electrode of the odd TFT $20_{odd}$ located at the lower position in the plan view will be set as a second drain electrode facing portion. Both of the first drain electrode facing portion and the second drain electrode facing portion are formed in a rectangular shape which is stretched rightward in the drawing from the data signal line DL.

Further, isolation films 33 and 34 (not shown) are formed on the upper side of the source electrode film SF. In the isolation films 33 and 34, an area located on the upper side of a part of the bonding portion of the source electrode film SF is eliminated, and a contact hole (not shown) is formed. The pixel electrode PT is formed to be electrically connected to the source electrode film SF via the contact hole.

Further, the drain electrode film DF is formed above the gate electrode film GF via the gate isolation film 32 and the like, and there is an area where the gate electrode film GF and the drain electrode film DF overlap with each other in the plan view in addition to the area serving as the TFT 20. When the gate isolation film 32 is not sufficiently formed in such an area, there is a danger in which the gate electrode film GF and the drain electrode film DF are electrically connected to each other. In order to more reliably ensure the electrical isolation property between the gate electrode film GF and the drain electrode, the silicon semiconductor film ASF is formed in an area where the gate electrode film GF and the drain electrode film DF overlap with each other in the plan view in addition to the silicon semiconductor film ASF of the TFT 20.

FIG. 4B is a plan view illustrating another example of a structure of two pixel circuits of the liquid crystal display device 1 according to the first embodiment of the invention. FIG. 4B shows, for example, two pixel circuits disposed at the first and second locations from the left side in the second row from the upper side of FIG. 3.

Two pixel circuits shown in FIG. 4A are disposed at the right side of the data signal line DL to be connected, but two pixel circuits shown in FIG. 4B are respectively disposed on both sides of the data signal line DL to be connected. Further, two pixel circuits shown in FIG. 4A are sequentially disposed from the left side of the drawing in an order of the odd pixel circuit and the even pixel circuit, but two pixel circuits shown in FIG. 4B are sequentially disposed from the left side of the drawing in an order of the even pixel circuit and the odd pixel circuit.

For this reason, in FIGS. 4A and 4B, the arrangements of the odd pixel circuit and the even pixel circuit are different, but the basic structures of the odd pixel circuit and the even pixel circuit are the same. The shape of the drain electrode film DF shown in FIG. 4B is different from the shape of the drain electrode film DF shown in FIG. 4A as below.

As in the drain electrode film DF shown in FIG. 4A, the data signal line DL included in the drain electrode film DF shown in FIG. 4B includes the primary data signal line portion and the secondary data signal line portion, and the primary data signal line portion shown in FIG. 4B extends in the longitudinal direction (Y direction) of the drawing in a zigzag shape in the same manner as described above.

The primary data signal line portion shown in FIG. 4B is stretched leftward in the drawing at the lower side of the even pixel circuit located at the left side of FIG. 4B, is bent downward in the drawing, and is stretched downward in the drawing. The secondary data signal line portion is stretched leftward in the drawing from the bent portion, is bent upward in the drawing from the vicinity of the left end of the even pixel circuit, and is stretched upward in the drawing. Then, the secondary data signal line portion contacts the drain electrode of the even TFT $20_{even}$ of the even pixel circuit located at the left side of the drawing.

The display device according to the invention is characterized in that it has the structure of the even TFT $20_{even}$ (first transistor) and the odd TFT $20_{odd}$ (second transistor). Here, the even TFT $20_{even}$ is provided in the even pixel circuit (first pixel circuit) disposed on the upper side (one side) of the even scanning signal line $GL_{even}$ (first gate interconnection). Further, the odd TFT $20_{odd}$ is provided in the odd pixel circuit (second pixel circuit) disposed on the lower side (the other side) of the odd scanning signal line $GL_{odd}$ (second gate interconnection).

The source electrode of the even TFT $20_{even}$ is stretched leftward in the drawing from the right side of, for example, FIGS. 4A and 4B, and the source electrode includes the first source electrode facing portion which overlaps with the gate electrode of the even TFT $20_{even}$ in the plan view, and is stretched leftward in the drawing. In the same manner, the source electrode of the odd TFT $20_{odd}$ includes the second source electrode facing portion which overlaps with the gate electrode of the odd TFT $20_{odd}$ in the plan view, and is stretched along the stretching direction of the first source electrode facing portion.

The source electrode of the even TFT $20_{even}$ includes the first source electrode portion, and the source electrode of the odd TFT $20_{odd}$ includes the second source electrode portion which is stretched along the first source electrode portion. Accordingly, even when a positional deviation occurs between the gate electrode and the source electrode when the substrate is manufactured, it is possible to suppress different systematic changes caused by the positional deviation in the facing area of the gate electrode and the source electrode in the even TFT $20_{even}$ and the odd TFT $20_{odd}$. As a result, even in parasitic capacitance Cgs generated between the gate electrode and the source electrode, it is possible to suppress systematic error between the even TFT $20_{even}$ and the odd TFT $20_{odd}$. Accordingly, it is possible to suppress systematic difference in accordance with a reduction in pixel voltage caused by parasitic capacitance Cgs, and to suppress regular abnormal display.

In the source electrode of the even TFT $20_{even}$, it is desirable that the first source electrode facing portion is stretched in a predetermined direction. At this time, in the source electrode of the odd TFT $20_{odd}$, even the second source electrode facing portion is stretched in the predetermined direction. Further, it is more desirable that the predetermined direction is set as the direction extending along with the even scanning signal line $GL_{even}$ or the odd scanning signal line $GL_{odd}$. Systematic error caused by a positional deviation may be further suppressed.

In the source electrode of the even TFT $20_{even}$, it is more desirable that the length of the first source electrode facing portion in the stretching direction is longer than the width of the first source electrode facing portion. In the source electrode of the odd TFT $20_{odd}$, it is more desirable that the length of the second source electrode facing portion in the stretching direction is longer than the width of the second source electrode facing portion.

The drain electrode of the even TFT $20_{even}$ is stretched rightward from the left side of, for example, FIGS. 4A and 4B, and the drain electrode includes the first drain electrode facing portion which overlaps with the gate electrode of the even TFT 20 in the plan view and is stretched rightward in the drawing. In the same manner, the drain electrode of the odd TFT $20_{odd}$ includes the second drain electrode facing portion which overlaps with the gate electrode of the odd TFT $20_{odd}$ in the plan view and is stretched along the stretching direction of the first drain electrode facing portion.

The drain electrode of the even TFT $20_{even}$ includes the first drain electrode portion which is stretched in the reverse direction of the stretching direction of the first source electrode facing portion, and the drain electrode of the odd TFT $20_{odd}$ includes the second drain electrode portion which is stretched along the first drain electrode portion. Accordingly, as in the parasitic capacitance Cgs with respect to a positional deviation between the gate electrode and the drain electrode, systematic errors of parasitic capacitance generated between the gate electrode and the drain electrode are suppressed in the even TFT $20_{even}$ and the odd TFT $20_{odd}$. Further, since the characteristics of the even TFT $20_{even}$ and the odd TFT $20_{odd}$ are more improved, the display quality is more improved.

In the even TFT $20_{even}$ and the odd TFT $20_{odd}$, for example, in FIG. 4A and FIG. 4B, the source electrode is stretched leftward from the right side with respect to the gate electrode, and the drain electrode is stretched rightward from the left side. In this manner, the second drain electrode facing portion of the odd TFT $20_{odd}$ is stretched along the first drain electrode facing portion of the even TFT $20_{even}$. When one data signal line is connected to the adjacent two pixel circuits, the data signal line DL includes the secondary data signal line portion which is branched from the primary data signal line portion and extends to the drain electrode with respect to at least one of the pixel circuits of the TFTs 20. For example, in the case shown in FIG. 4A, two pixel circuits are disposed at the right side of the data signal line DL. The primary data signal line portion and the drain electrode of the odd TFT $20_{odd}$ may be connected to the odd TFT $20_{odd}$ located at the left side. However, as for the even TFT $20_{even}$ located at the right side, the secondary data signal line portion branched from the primary data signal line portion and connected to the drain electrode is required between the primary data signal line portion and the drain electrode of the even TFT $20_{even}$. Further, in the case shown in FIG. 4B, two pixel circuits are disposed on both sides of the data signal line DL. The primary data signal line portion and the drain electrode of the odd TFT $20_{odd}$ may be connected to the odd TFT $20_{odd}$ located at the right side of the data signal line DL. However, for the connection to the drain electrode of the even TFT $20_{even}$ located at the left side of the data signal line DL from the left side of the drawing, the secondary data signal line portion branched from the primary data signal line portion and connected to the drain electrode is required between the primary data signal line portion and the drain electrode of the even TFT $20_{even}$.

In the even TFT $20_{even}$ and the odd TFT $20_{odd}$ shown in FIGS. 4A and 4B, the arrangements of the source electrode and the drain electrode are the same. That is, in the even TFT $20_{even}$ and the odd TFT $20_{odd}$, the source electrode is stretched leftward from the right and lower side of the silicon semiconductor film ASF with respect to the silicon semiconductor film ASF located above the gate electrode, and the drain electrode is stretched rightward from the left and upper side of the silicon semiconductor film ASF.

In this manner, the drain electrode may be disposed with respect to the source electrode of the odd TFT $20_{odd}$ in accordance with the arrangement of the drain electrode with respect to the source electrode of the even TFT $20_{even}$. In particular, it is more desirable that the shapes of the source electrode and the drain electrode are the same in the even TFT $20_{even}$ and the odd TFT $20_{odd}$ in addition to the arrangements.

Since the arrangement of the source electrode and the drain electrode corresponds to each other in the even TFT $20_{even}$ and the odd TFT $20_{odd}$, systematic errors of the characteristics of the TFT 20 are suppressed, and systematic errors of the parasitic capacitance Cgs caused by a positional deviation are suppressed, whereby the display quality is improved.

Further, in the TFT 20, the shapes of the gate electrode film GF, the source electrode film SF, and the drain electrode film DF are shown in, for example, FIG. 4A or FIG. 4B. The shape may be determined in consideration of an error in positional deviation generated when forming a multi-layer structure.

Further, in the case of the configuration of the display area shown in FIG. 3, the plural pixel circuits arranged in the first and third rows from the upper side of the drawing have the structure shown in FIG. 4A, but the plural pixel circuits arranged in the second row have the structure shown in FIG. 4B. All plural pixel circuits forming the display area may have the structure shown in FIG. 4A or FIG. 4B. Further, in the case of the configuration of the display area shown in FIG. 3, as the method of arranging two pixel circuits connected in each row with respect to one data signal line DL extending along with the longitudinal direction, the pixel circuits are arranged in an order of the odd pixel circuit and the even pixel circuit, and are alternately arranged in an order of the even pixel circuit and the odd pixel circuit. However, in all rows, the pixel circuits may be arranged in an order of the odd pixel circuit and the even pixel circuit or vice versa.

Figure 5:
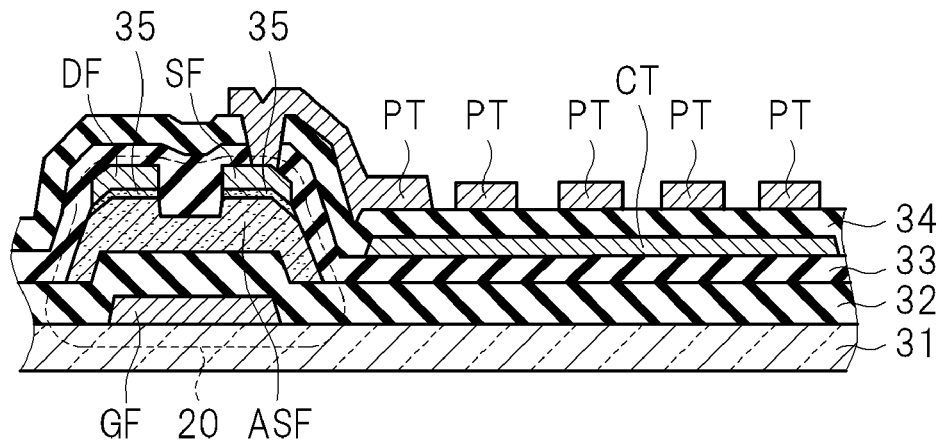
FIG. 5 is a cross-sectional view illustrating a TFT of the liquid crystal display device according to the first embodiment of the invention.

FIG. 5 is a cross-sectional view illustrating the TFT 20 of the liquid crystal display device 1 according to the first embodiment of the invention. FIG. 5 is a schematic view illustrating a cross-section taken along the line 5-5 of FIG. 4A, where the scale is different from the actual scale for easy understanding of the structure of the TFT 20.

As shown in FIG. 5, the gate electrode film GF is provided on the upper side of a transparent substrate 31 and the silicon semiconductor film ASF is formed above the upper side of the gate electrode film GF with the gate isolation film 32 interposed therebetween. The drain electrode film DF and the source electrode film SF are formed on both ends of the upper portion of the silicon semiconductor film ASF with the impurity silicon semiconductor film 35 interposed therebetween.

Here, the main material of the gate electrode film GF is metal such as Al. Further, the silicon semiconductor film ASF is formed of amorphous silicon, but may be formed of polycrystalline silicon (poly silicon) or microcrystalline silicon. However, when the silicon semiconductor film ASF is formed of polycrystalline silicon or microcrystalline silicon, since the silicon semiconductor film layer is heated at a high temperature during a process of crystallizing silicon, it is desirable that the gate electrode film GF is formed of a conductive material having a comparatively high melting point such as molybdenum (Mo), tungsten (W), titanium (Ti), tantalum (Ta), or an alloy thereof.

The impurity silicon semiconductor film 35 is formed of amorphous silicon doped with impurity such as phosphorus (P), and serves as an ohmic contact with respect to the drain electrode film DF and the source electrode film SF. Further, the main materials of the drain electrode film DF and the source electrode film SF are metal such as Al. The drain electrode film DF and the source electrode film SF are electrically isolated from each other. Further, the ohmic contact indicates that the characteristics between a voltage and a current have a linear relationship at the electrical contact portion between the interconnection layer and the semiconductor layer, for example.

The isolation film 33 is formed on the upper side of the drain electrode film DF and the source electrode film SF, and the reference electrode CT is formed in a predetermined area on the upper side thereof. The reference electrode CT is formed of indium tin oxide (ITO), but may be formed of indium zinc oxide (InZnO) or tin oxide ($SnO_2$). The isolation film 34 is formed on the upper side of the reference electrode CT. The isolation films 33 and 34 on the upper side of the contact portion of the source electrode film SF are eliminated, and a contact hole is formed therein.

The pixel electrode PT is formed on the upper side of the isolation film 34, and is electrically connected to the source electrode film SF via the contact hole. Further, the pixel electrode PT is electrically isolated from the reference electrode CT by the isolation film 34. The pixel electrode PT is formed in a interdigital shape, and a transverse electric field is generated between slip portions of the pixel electrode PT due to the voltage applied between the pixel electrode PT and the reference electrode CT. As in the reference electrode CT, the pixel electrode PT is formed of ITO, but may be formed of InZnO, $SnO_2$, or the like.

Here, a source top type TFT substrate is described in which the pixel electrode PT connected to the source electrode film SF is disposed above the reference electrode CT. However, a common top type TFT substrate may be adopted in which the reference electrode CT to which a reference voltage (common voltage) is supplied is disposed above the pixel electrode PT. In this case, the pixel electrode PT is formed in a plane shape, and the reference electrode CT is formed in a shape which has plural slits in the upper area of the pixel electrode PT.

Hereinafter, a method of manufacturing the TFT substrate 102 according to the first embodiment will be described.

First, a contamination prevention film (not shown) is formed on the upper side of a transparent substrate 31 such as a glass substrate by using silicon nitride film ($SiN_X$) or the like, and a metal layer (gate electrode layer) is formed by sputtering.

A photoresist (not shown) is formed throughout the upper surface of the metal layer. For example, the photoresist present at the area serving as the gate electrode film GF shown in FIG. 4A is left, and the photoresist present at the other areas are eliminated by photolithography. By using the left photoresist as a mask, an area where the photoresist is eliminated in the metal layer is eliminated by etching. Subsequently, the left photoresist is eliminated by, for example, asking using oxygen plasma or peeler. The above-described procedure is selective etching using photolithography, and according to the above-described procedure, the gate electrode film GF is formed.

Next, the gate isolation film 32 and a silicon semiconductor layer are formed throughout the upper surface of the substrate to cover the gate electrode film GF. The silicon semiconductor layer is formed in a shape shown in FIG. 4A by selective etching using photolithography, so that the silicon semiconductor film ASF is formed. Here, the gate isolation film 32 and the silicon semiconductor layer are continuously formed by CVD (Chemical Vapor Deposition). The gate isolation film 32 is formed of, for example, silicon dioxide. In this manner, when the film is continuously formed by the same device through CVD, alien materials may be greatly suppressed from intruding into the boundary surface formed when forming the respective layers and the respective layers or contamination at the boundary surface and the respective layers may be greatly reduced.

The silicon semiconductor layer formed by CVD is amorphous silicon. When the silicon semiconductor film ASF is formed of polycrystalline silicon or microcrystalline silicon, amorphous silicon is heated by RTA (Rapid Thermal Annealing), ELA (Exicimer Laser Annealing), or the like to be crystallized.

The impurity silicon semiconductor film 35 is formed by laminating a film above the silicon semiconductor film ASF through, for example, CVD, and performing selective etching through photolithography in the same manner. As described above, the impurity silicon semiconductor film 35 is formed of amorphous silicon doped with impurity such as phosphorus (P).

Subsequently, the drain electrode film DF and the source electrode film SF are formed by forming a metal layer (source electrode layer and drain electrode layer) mainly including, for example, Al through sputtering, and performing selective etching through photolithography to have a shape, for example, shown in FIG. 4A. Further, the impurity silicon semiconductor film 35 located between the area serving as the drain electrode of the TFT 20 and the area serving as the source electrode thereof is subjected to over-etching, so that the silicon semiconductor film ASF located at the lower layer is sufficiently exposed in the area. Accordingly, the impurity silicon semiconductor film 35 serves as an ohmic contact with respect to the drain electrode and the source electrode of the TFT 20, and the drain electrode film DF and the source electrode film SF are electrically isolated from each other.

The isolation film 33 is formed throughout the upper surface of the substrate by, for example, CVD. The isolation film 33 is formed of, for example, a silicon nitride (SiN) film. Further, the reference electrode CT is formed by forming an ITO layer through sputtering and performing selective etching on the ITO layer through photolithography. Next, the isolation films 33 and 34 formed on the contact area of the source electrode film SF are eliminated by selective etching through photolithography after the isolation film 34 is formed, and a contact hole is formed. Subsequently, an ITO layer is formed by sputtering, and the pixel electrode PT is formed by selectively performing etching on the ITO layer through photolithography. At this time, the source electrode film SF and the pixel electrode PT are electrically connected to each other via the contact hole.

[Second Embodiment]

A display device according to a second embodiment of the invention is a certain type of liquid crystal display device 1 in the IPS liquid crystal display device as in the liquid crystal display device according to the first embodiment. The basic configuration of the liquid crystal display device 1 according to the embodiment is the same as that of the liquid crystal display device 1 according to the first embodiment. In the liquid crystal display device 1 according to the second embodiment, the structure of the TFT 20 provided in the pixel circuit is different from the structure of the liquid crystal display device 1 according to the first embodiment.

Figure 6A:
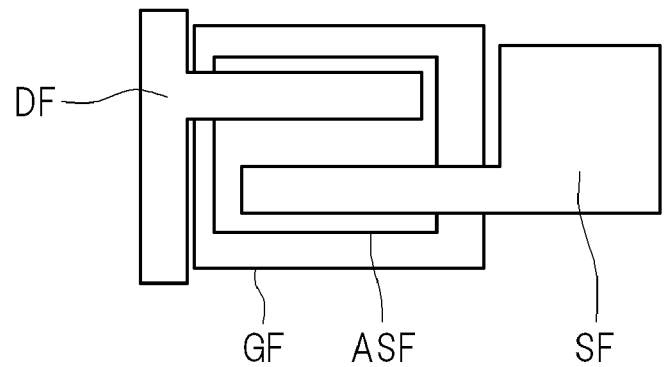
FIG. 6A is a schematic view illustrating an example of a structure of a TFT according to a second embodiment of the invention.

FIG. 6A is a schematic view illustrating an example of a structure of the TFT 20 according to the second embodiment. In FIG. 6A, as described above, the silicon semiconductor film ASF is disposed above the gate electrode film GF, and the source electrode film SF and the drain electrode film DF are formed above the silicon semiconductor film ASF. In the TFT 20 shown in FIG. 6A, the structure of the odd TFT $20_{odd}$ and the even TFT $20_{even}$ of the liquid crystal display device 1 according to the first embodiment is schematically shown.

Both in the even TFT $20_{even}$ and the odd TFT $20_{odd}$, the source electrode of the TFT 20 is stretched leftward in the drawing from the bonding portion of the source electrode film SF. The drain electrode of the TFT 20 is stretched rightward in the drawing from the right side of the data signal line DL of the drain electrode film DF. The arrangement of the drain electrode with respect to the source electrode of the TFT 20 formed above the gate electrode film GF is the same between the even TFT $20_{even}$ and the odd TFT $20_{odd}$.

The basic structure of the TFT 20 is the same between the even pixel circuit including the even TFT $20_{even}$ and the odd pixel circuit including the odd TFT $20_{odd}$, but the arrangement of the pixel electrode PT is different. In the case of the liquid crystal display device 1 according to the first embodiment, in the even pixel circuit, the even pixel electrode $PT_{even}$ (not shown) is formed to be widened upward in the drawing of the source electrode film SF of the TFT 20 shown in FIG. 6A. On the contrary, in the odd pixel circuit, the odd pixel electrode $PT_{odd}$ (not shown) is formed to be widened downward in the drawing of the source electrode film SF of the TFT 20 shown in FIG. 6A.

Figure 6B:
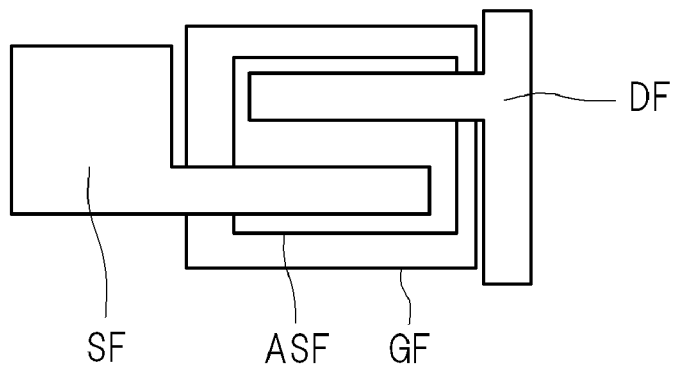
FIG. 6B is a schematic view illustrating an example of a structure of the TFT according to the second embodiment of the invention.

FIG. 6B is a schematic view illustrating an example of a structure of the TFT 20 according to the second embodiment. The structure of the TFT 20 shown in FIG. 6B is reversely line-symmetrical to the structure of the TFT 20 shown in FIG. 6A with respect to the center line extending in the longitudinal direction.

Both in the even TFT $20_{even}$ and the odd TFT $20_{odd}$, the source electrode of the TFT 20 is stretched rightward in the drawing from the bonding portion of the source electrode film SF. The drain electrode of the TFT 20 is stretched leftward in the drawing from the left side of the data signal line DL of the drain electrode film DF. The arrangement of the drain electrode with respect to the source electrode of the TFT 20 formed above the gate electrode film GF is the same between the even TFT $20_{even}$ and the odd TFT $20_{odd}$.

In the even pixel circuit and the odd pixel circuit, the arrangement of the pixel electrode PT is the same as that of the case shown in FIG. 6A. The same applies to the case of the drawings below.

Figure 7A:
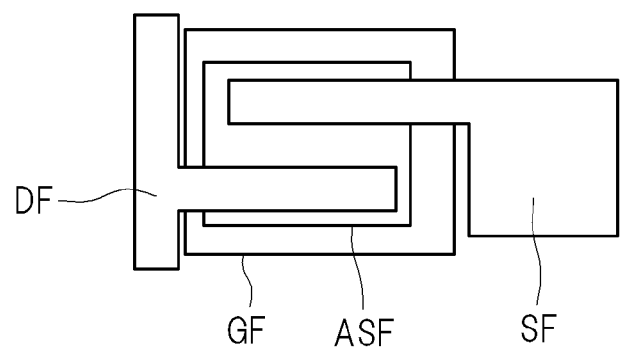
FIG. 7A is a schematic view illustrating an example of a structure of the TFT according to the second embodiment of the invention.

FIG. 7A is a schematic view illustrating an example of a structure of the TFT 20 according to the second embodiment of the invention. The structure of the TFT 20 shown in FIG. 7A is reversely line-symmetrical to the structure of the TFT 20 shown in FIG. 6A with respect to the center line extending in the transverse direction.

Figure 7B:
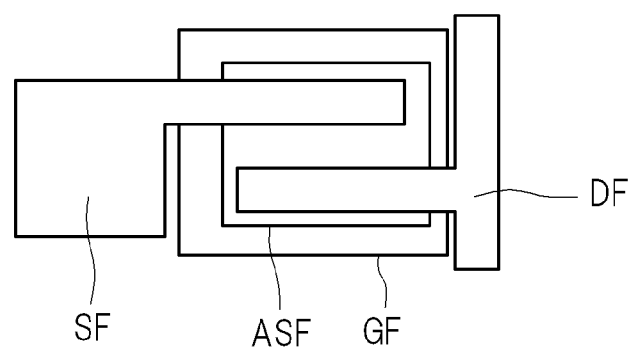
FIG. 7B is a schematic view illustrating an example of a structure of the TFT according to the second embodiment of the invention.

FIG. 7B is a schematic view illustrating an example of a structure of the TFT 20 according to the second embodiment of the invention. The structure of the TFT 20 shown in FIG. 7B is reversely line-symmetrical to the structure of the TFT 20 shown in FIG. 7A with respect to the center line extending in the longitudinal direction.

Figure 8A:
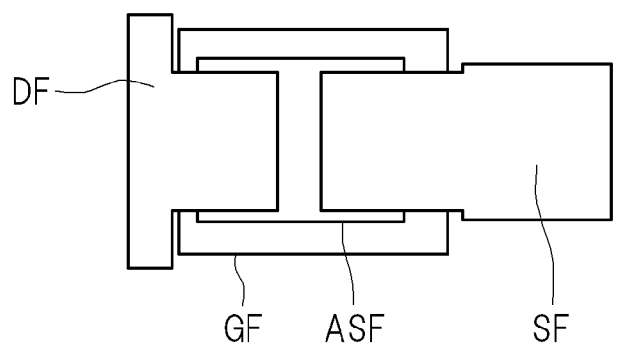
FIG. 8A is a schematic view illustrating an example of a structure of the TFT according to the second embodiment of the invention.

FIG. 8A is a schematic view illustrating an example of a structure of the TFT 20 according to the embodiment of the invention. Both in the even TFT $20_{even}$ and the odd TFT $20_{odd}$, the source electrode of the TFT 20 is stretched leftward in the drawing from the bonding portion of the source electrode film SF. The drain electrode of the TFT 20 is stretched rightward in the drawing from the right side of the data signal line DL of the drain electrode film DF. The arrangement of the drain electrode with respect to the source electrode of the TFT 20 formed above the gate electrode film GF is the same between the even TFT $20_{even}$ and the odd TFT $20_{odd}$.

In the TFT 20 shown in FIG. 8A, the source electrode of the source electrode film SF is stretched leftward from the right side of the drawing, and the drain electrode of the drain electrode film DF is stretched rightward from the left side of the drawing. Then, the source electrode at the right side of the drawing of the upper surface of the silicon semiconductor film ASF located above the gate electrode film GF is located at the left side of the drawing.

Figure 8B:
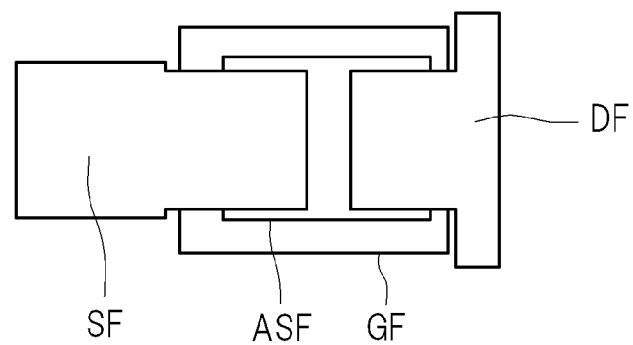
FIG. 8B is a schematic view illustrating an example of a structure of the TFT according to the second embodiment of the invention.

FIG. 8B is a schematic view illustrating an example of a structure of the TFT 20 according to the second embodiment of the invention. The structure of the TFT 20 shown in FIG. 8B is reversely line-symmetrical to the structure of the TFT 20 shown in FIG. 8A with respect to the center line extending in the longitudinal direction.

As described above, the TFT 20 may have various structures, but the arrangement of the drain electrode with respect to the source electrode may have a corresponding relationship between the even TFT $20_{even}$ and the odd TFT $20_{odd}$.

Figure 9:
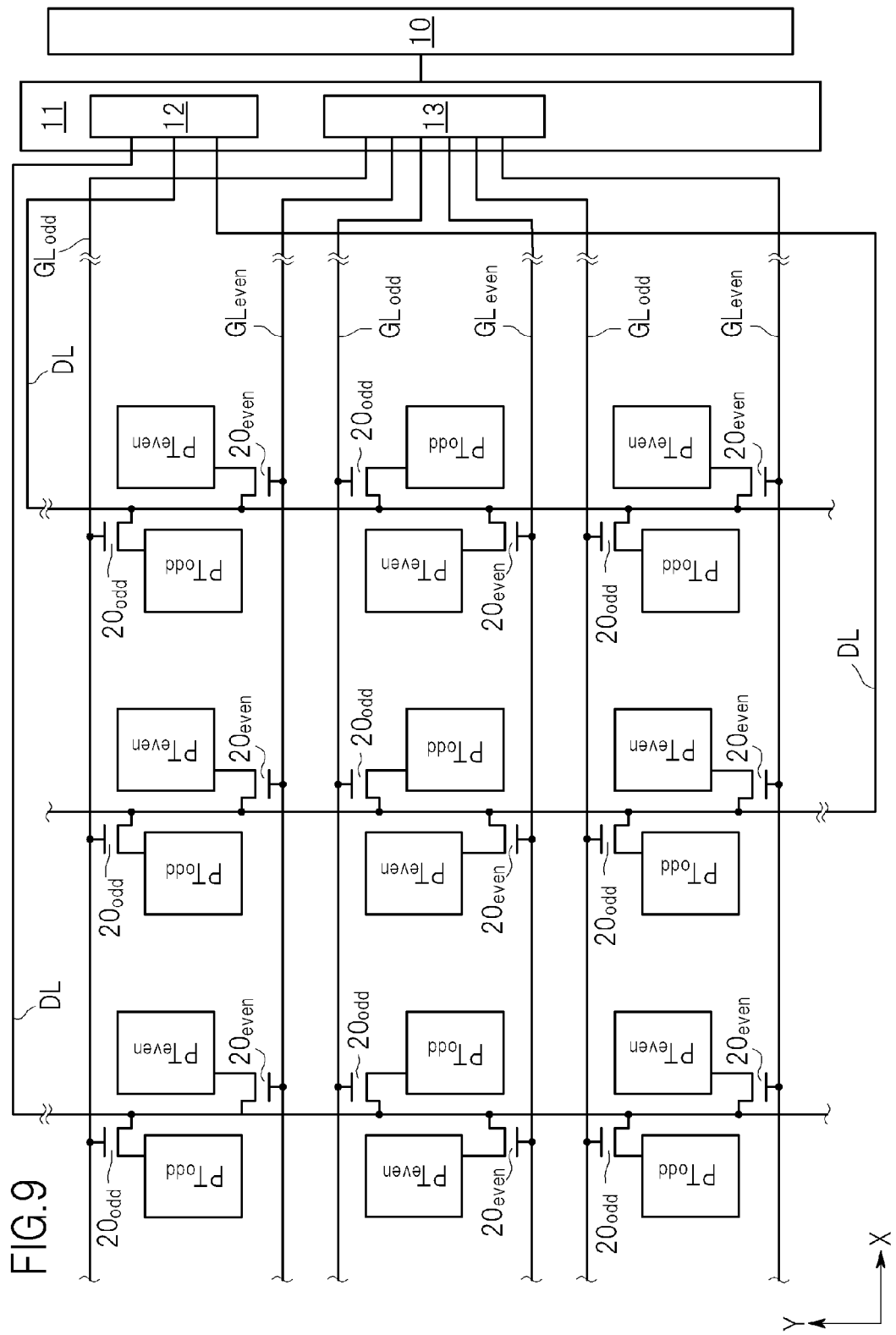
FIG. 9 is a diagram illustrating an equivalent circuit of a TFT substrate of a liquid crystal display device according to another embodiment of the invention.

Further, the IPS liquid crystal display device has been described as the display device according to the embodiments of the invention, but the invention may be applied to any type of liquid crystal display device such as a VA (Vertically Aligned) liquid crystal display device or a TN (Twisted Nematic) liquid crystal display device other than the IPS liquid crystal display device, any driving type liquid crystal display device, and other display devices. FIG. 9 is a diagram illustrating an equivalent circuit of the TFT substrate 102 of the liquid crystal display device 1 according to another embodiment of the invention. The liquid crystal display device 1 is a VA liquid crystal display device or a TN liquid crystal display device. In the case of the VA liquid crystal display device or the TN liquid crystal display device, the reference electrode CT (not shown) is provided on the filter substrate 101 facing the TFT substrate 102, and the pixel electrode PT is formed in a plane shape.

While there have been described what are at present considered to be certain embodiments of the invention, it will be understood that various modifications may be made thereto, and it is intended that the appended claims coverall such modifications as fall within the true spirit and scope of the invention.

What is claimed is:

1. A display device comprising:
   first and second gate interconnections extending along with each other;
   a first pixel circuit being disposed at a first side of the first gate interconnection, the first pixel circuit comprising a first transistor including a gate electrode, a source electrode and a drain electrode, the gate electrode of the first transistor being formed in a gate electrode layer and being electrically connected to the first gate interconnection, the source electrode of the first transistor being formed in a source electrode layer, the source electrode of the first transistor including a first source electrode facing portion overlapping with the gate electrode of the first transistor in the plan view and stretching to its end in a predetermined stretching direction; and
   a second pixel circuit being disposed at a second side of the second gate interconnection opposite to the first side, the second pixel circuit comprising a second transistor including a gate electrode, a source electrode, and a drain electrode, the gate electrode of the second transistor being formed in the gate electrode layer and being electrically connected to the second gate interconnection, the source electrode of the second transistor being formed in the source electrode layer, the source electrode of the second transistor including a second source electrode facing portion overlapping with the gate electrode of the second transistor in the plan view and stretching to its end in the same predetermined stretching direction as the first source electrode facing portion stretches.

2. The display device according to claim 1, wherein the first gate interconnection stretches in the same stretching direction as the first and second source electrode facing portions.

3. The display device according to claim 2,
   wherein the length of the first source electrode facing portion in the stretching direction is longer than the width of the first source electrode facing portion, and
   wherein the length of the second source electrode facing portion in the stretching direction is longer than the width of the second source electrode facing portion.

4. The display device according to claim 1,
   wherein the drain electrode of the first transistor includes a first drain electrode facing portion which overlaps with the gate electrode of the first transistor in the plan view and stretches to its end in a reverse direction of the stretching direction of the first and second source electrode facing portions, and
   wherein the drain electrode of the second transistor includes a second drain electrode facing portion which overlaps with the gate electrode of the second transistor in the plan view and stretches to its end in the same reverse direction as the first drain electrode facing portion stretches.

5. The display device according to claim 4, further comprising:
   a data signal interconnection being electrically connected to the drain electrode of the first transistor, the data signal interconnection being branched and extending to the drain electrode of the first transistor.

6. The display device according to claim 4, wherein the drain electrode of the second transistor is disposed with respect to the source electrode of the second transistor in accordance with the arrangement of the first drain electrode with respect to the source electrode of the first transistor.

* * * * *